(12) United States Patent
Fuchikami et al.

(10) Patent No.: US 6,580,634 B2
(45) Date of Patent: Jun. 17, 2003

(54) DATA MEMORY DEVICE

(75) Inventors: Takaaki Fuchikami, Ukyo-ku (JP); Takanori Ozawa, Ukyo-ku (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/969,211

(22) Filed: Oct. 1, 2001

(65) Prior Publication Data

US 2002/0039307 A1 Apr. 4, 2002

(30) Foreign Application Priority Data

Oct. 4, 2000 (JP) ........................................ 2000-304596
Sep. 5, 2001 (JP) ........................................ 2001-268898

(51) Int. Cl.[7] ............................................. G11C 11/22
(52) U.S. Cl. ................... 365/145; 365/149; 365/189.01
(58) Field of Search ........................ 365/145, 189.01, 365/149

(56) References Cited

U.S. PATENT DOCUMENTS 5,745,403 A * 4/1998 Taylor ......................... 365/145
5,978,252 A * 11/1999 Miwa ......................... 365/145
6,246,602 B1 * 6/2001 Nishimura ................... 365/145

* cited by examiner

*Primary Examiner*—Son T. Dinh
(74) *Attorney, Agent, or Firm*—Hogan & Hartson, LLP

(57) ABSTRACT

A data memory device is provided that is capable of reading data accurately even if the reading action is repeated. Respective output ends of memory cells D0–D7 and input ends on one side of respective exclusive OR elements Eo0–Eo7 are interconnected, and the output end of a polarity holding cell Dc and the input ends on the other side of the respective exclusive OR elements Eo0–Eo7 are interconnected. When it is assumed that the stored value of the memory cell D0 is a logic "1" and the stored value of the polarity holding cell Dc is a logic "0," the value of the output data Do0 read out becomes a logic "1". By the reversal writing action that follows, the value of the memory cell D0 becomes a logic "0" and the stored value of the polarity holding cell Dc becomes a logic "1." When the value of the memory cell D0 is read again in that state, the value of the output data Do0 is still a logic "1." That is to say, even if data reading action is repeated, values of the output data Do0–Do7 remain unchanged. However, the direction of polarization of respective ferroelectric capacitors constituting the memory cells D0–D7 and the polarity holding cell Dc are reversed every time of the reading.

15 Claims, 9 Drawing Sheets

DATA MEMORY DEVICE

CROSS-REFERENCE TO RELATED APPLICATION

The entire disclosure of Japanese patent application No. 2000-304596 filed on Oct. 4, 2000 and Japanese patent application No. 2001-268898 filed on Sep. 5, 2001 including their specifications, claims, drawings, and summaries are entirely incorporated herein by reference in its entirety.

BACKGROUND OF THE INVENTION

1. Field of the Invention

The present invention relates to a data memory device, in particular to one having data memory elements with its direction of change in the data holding characteristic being different according to the value of data to be stored.

2. Description of the Prior Art

Ferroelectric memory elements using ferroelectric capacitors are known as data memory elements constituting data memory devices. FIG. 9 shows part of a circuit constitution of a type of conventional ferroelectric memory element, a ferroelectric memory element 2 of the 1T1C (one-transistor one-capacitor) type.

The ferroelectric memory element 2 comprises a ferroelectric capacitor 4 and a loading capacitor 6. The ferroelectric capacitor 4 has stored data of "1" or "0" in nonvolatile manner corresponding to the difference in residual polarization arising from hysteresis characteristic of the ferroelectric.

When reading data, a reading-purpose voltage is applied to the plate line PL to detect a voltage Vbl (not shown) appearing on the bit line BL. The value of the voltage Vbl varies with the value of the residual polarization of the ferroelectric capacitor 4.

Therefore, whether a data "1" or "0" has been stored in the ferroelectric capacitor 4 can be found by judging whether the voltage Vbl is higher or lower than a reference voltage Vref (not shown). Thus, nonvolatile data memory devices may be easily realized using the ferroelectric memory element 2.

However, the conventional ferroelectric memory element 2 has the following problems: When the same data are stored in the ferroelectric memory element 2 for an extended period of time, the hysteresis characteristic of the ferroelectric capacitor 4 is distorted by the so-called imprint effect, which is aggravated by repeated action of reading data from the ferroelectric memory element 2.

In particular in case of the so-called destructive type of memory element such as the ferroelectric memory element 2, data destroyed by reading must be restored by rewriting. The high voltage for the rewriting further intensifies the tendency of the imprint effect.

When the hysteresis characteristic of the ferroelectric capacitor 4 is distorted by the imprint effect, it becomes difficult to determine whether or not the voltage Vbl is greater than the reference voltage Vref and so data cannot be read accurately.

SUMMARY OF THE INVENTION

The present invention is intended to provide a data memory device capable of reading data accurately even after repeated reading actions by solving the above-described problems encountered with the conventional memory device.

A data memory device according to the present invention, comprising
  data memory elements with its directions of change in the data holding characteristic being different according to the value of data to be stored,
  a data memory element for storing data either as not reversed or as reversed in nonvolatile manner, and
  a state memory section for storing whether the data stored in the data memory element is in the non-reversed state or in the reversed state,
  characterized by being constructed such that, when reading data from the data memory element, the data stored in the data memory element is outputted either in non-reversed or reversed stats according to whether the value of the state memory section represents non-reversed or reversed state, the data stored in the data memory element is reversed and stored again in the data memory element, and the value of the state memory section is reversed and stored again.

While the present invention may be broadly described above, its constitution and contents together with its purpose and features will become more apparent from the following disclosure in reference to the appended drawings.

DESCRIPTION OF PREFERRED EMBODIMENTS

Figure 1:
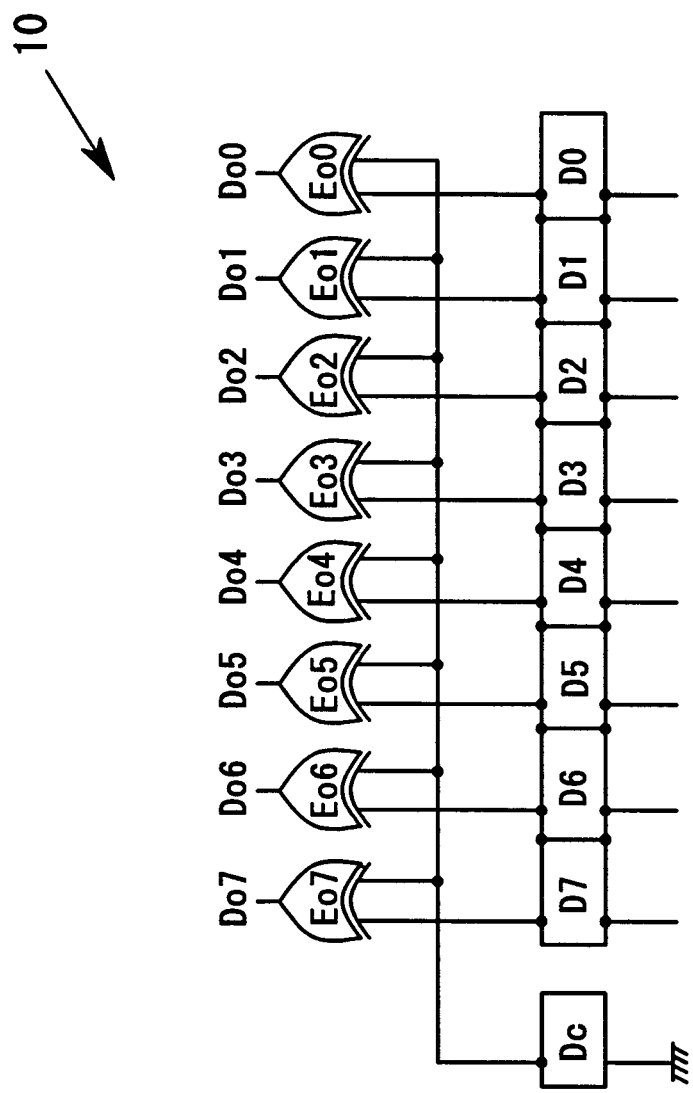
FIG. 1 schematically shows part (for one access) of the circuit constitution of a ferroelectric memory 10, a nonvolatile data memory device, as an embodiment of the present invention.
Figure 2A:
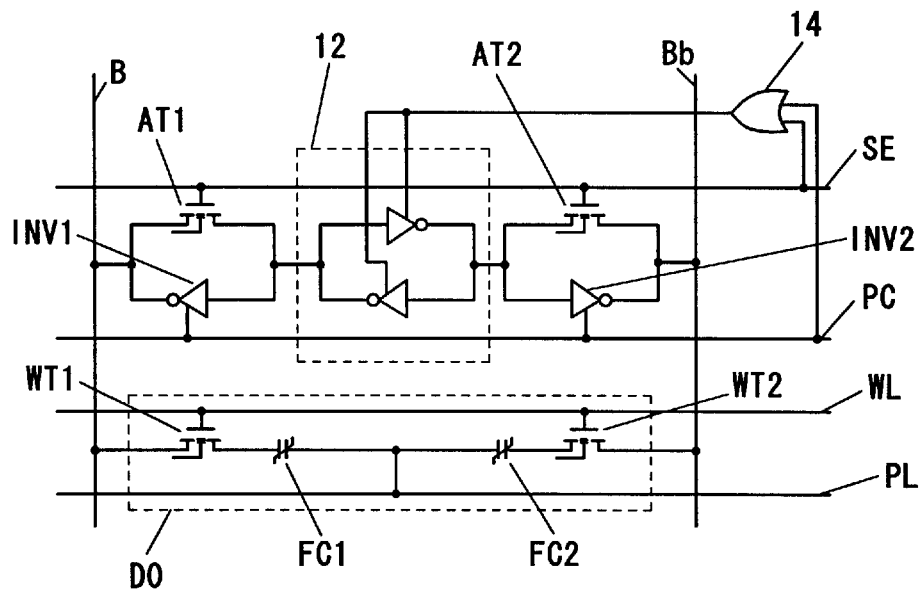
FIG. 2A shows part of a circuit diagram of a column of a matrix that includes a memory cell D0.

FIG. 1 schematically shows part (one access unit) of the circuit constitution of a ferroelectric memory 10, a nonvolatile data memory device, as an embodiment of the present invention. Actually the ferroelectric memory 10 comprises a large number of data memory elements, or memory cells D0, . . . and state memory sections or polarity holding cells Dc arranged in a matrix pattern, with each column of the matrix provided with a sensing amplifier 12 (FIG. 2A).

The ferroelectric memory 10 is of the type in which 8 bit (1 byte) of memory cells D0–D7 as a minimum access unit and a corresponding polarity holding cell Dc of 1 bit are driven through an independent plate line PL and a word line WL(FIGS. 2A and 2B) and used for example as a register in calculating operations.

As shown in FIG. 1, in the memory cell 10, a polarity holding cell Dc is provided to each group of the memory cells D0–D7 of 8 bits (one access unit). The ferroelectric memory cell 10 is provided with exclusive OR elements Eo0, . . . in respective columns that include memory cells of the matrix.

The output terminals of the memory cells D0–D7 and the input terminals on one side of the exclusive OR elements $E_o0$–$E_o7$ are interconnected. The output terminal of the polarity holding cell Dc is connected to the input terminals on the other side of the exclusive OR elements $E_o0$–$E_o7$.

When data are to be written to the ferroelectric memory 10, input data Di0–Di7 (8 bits) are inputted to the input terminals of the memory cells D0–D7 at a time. When data are to be read from the ferroelectric memory 10, output data $D_o0$–$D_o7$ (8 bits) are read at a time at the output terminals of the exclusive OR elements $E_o0$–$E_o7$.

FIG. 2A shows part of the circuit diagram of a column of a matrix that includes a memory cell D0. Each column of the matrix comprises memory cells D0, . . . arranged in the vertical (column) direction (only the memory cell D0 is shown). The memory cells D0, . . . are connected in parallel between paired bit lines B and Bb.

Figure 2B:
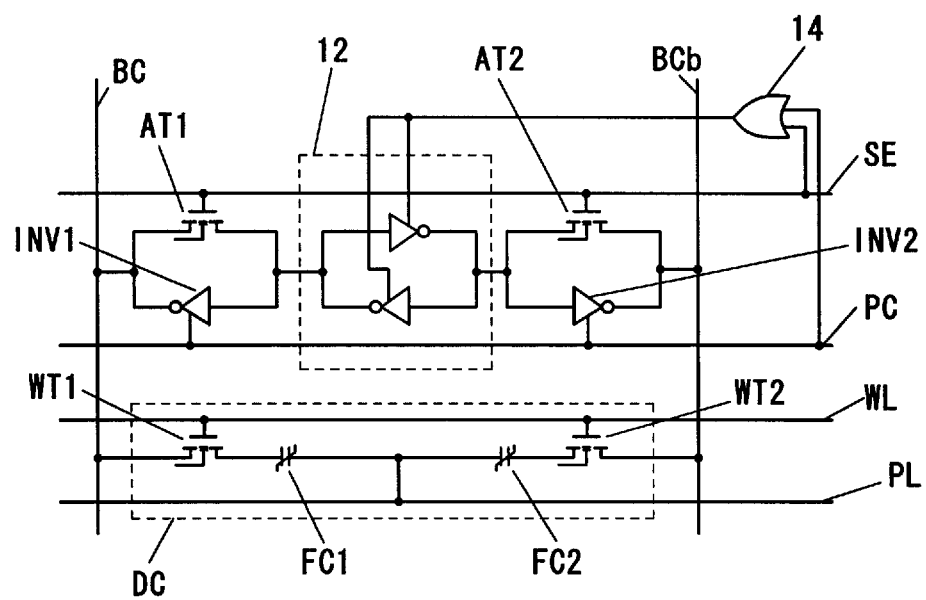
FIG. 2B shows part of a circuit diagram of a column of a matrix that includes a polarity holding cell Dc.

FIG. 2B shows part of a circuit diagram of a column of the matrix that includes polarity holding cells Dc. The column of the matrix comprises polarity holding cells Dc, . . . arranged in the vertical (column) direction (only one polarity holding cell Dc is shown). Each of the polarity holding cells Dc, . . . is connected as interposed in parallel between paired bit lines BC and BCb.

Since the memory cells D0, . . . and the polarity holding cells Dc, . . . are of an identical constitution, the constitution of the memory cell D0 is described as a representative. The memory cells D0 is a so-called 2T2C (two-transistor two-capacitor) type of ferroelectric memory element comprising paired ferroelectric capacitors FC1 and FC2.

The ferroelectric capacitors FC1 and FC2 are constituted to hold complementary polarized states. The ends on one side of the ferroelectric capacitors FC1 and FC2 are both connected to a plate line PL. The ends on one side of the ferroelectric capacitors FC1 and FC2 of the 8-bit memory cells D0–D7 constituting one access unit and the corresponding 1-bit polarity holding cell Dc shown in FIG. 1 are connected to a plate line PL.

The ends on the other side of the ferroelectric capacitors FC1 and FC2 are respectively connected to paired bit lines B (or BC) and Bb (or BCb) through transistors WT1 and WT2. The ends on the other side of ferroelectric capacitors of the memory cells (or polarity holding cells Dc) constituting the same column are respectively connected to paired bit lines B (or BC) and Bb (or BCb) through paired transistors.

The gates of the transistors WT1 and WT2 are connected to a word line WL. Though not shown, the gates of the transistors WT1 and WT2 of other memory cells D1–D7 constituting the same access unit as the memory cell D0 and the polarity holding cell Dc corresponding to the memory cells are also connected to the word line WL.

A sensing amplifier 12 is connected as interposed between paired bit lines B (or BC) and Bb (or BCb) through a circuit formed with a transistor AT1 and an inverter INV1 interconnected in parallel and through a circuit formed with a transistor AT2 and an inverter INV2 interconnected in parallel.

The gates of the transistors AT1 and AT2 are connected to a sense enabling line SE. Therefore, the sensing amplifier 12 may be connected without reversing its output to the paired bit lines B (or BC) and Bb (or BCb) by making the sense enabling line SE a logic "1."

Though not shown, gates of transistors AT1 and AT2 of the column that includes other memory cells D1–D7 constituting the same access unit as the memory cell D0 and the polarity holding cell Dc corresponding to the memory cells are also connected to the sense enabling line SE.

The power supply lines of inverters INV1 and INV2 are connected to a reversal control line PC. Therefore, with the reversal control line PC made a logic "1," the sensing amplifier 12 may be connected to the paired bit lines B (or BC) and Bb (or BCb) with its output reversed.

Though not shown, the power supply lines of the inverters INV1 and JNV2 of the column that includes other memory cells D1–D7 constitute the same access unit as the memory cell D0 and the polarity holding cell Dc corresponding to the memory cells are also connected to the reversal control line PC.

The sense enabling line SE and the reversal control line PC are connected to the power supply lines of the sensing amplifier 12 through an OR element 14. That is, the sensing amplifier 12 may be turned on by making the sense enabling line SE or the reversal control line PC a logic "1."

For example, the bit line B shown in FIG. 2A corresponds to the input-output terminal of the memory cell D0. That is, input data Di0 (FIG. 1) to be written into the memory cell D0 is given to the bit line B shown in FIG. 2A.

Data read from the memory cell D0 is inputted through the bit line B shown in FIG. 2A to one input terminal of the exclusive OR element Eo0 shown in FIG. 1. Likewise, data read from the polarity holding cell Dc shown in FIG. 2B is inputted through the bit line B shown in FIG. 2B to the other input terminal of the exclusive OR element Eo0 shown in FIG. 1.

Figure 3A:
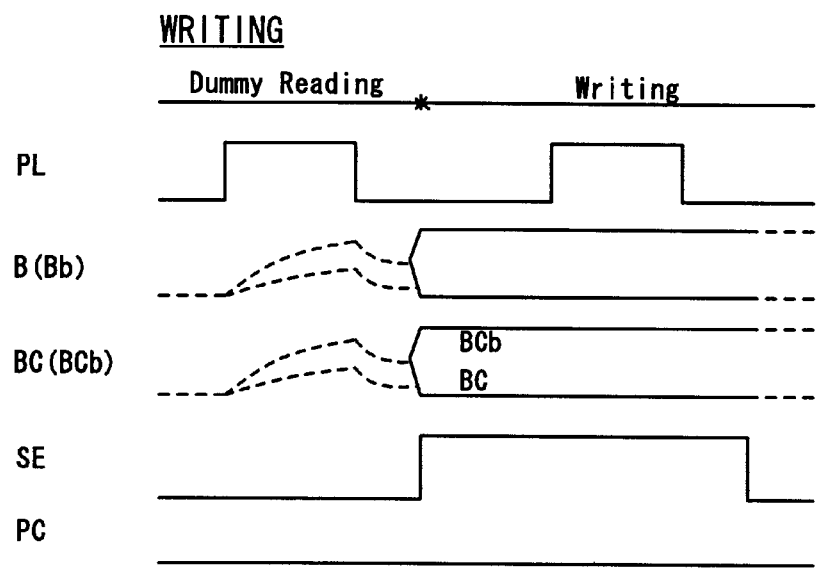
FIG. 3A is a timing chart for explaining the action of writing data to the ferroelectric memory 10.
Figure 3B:
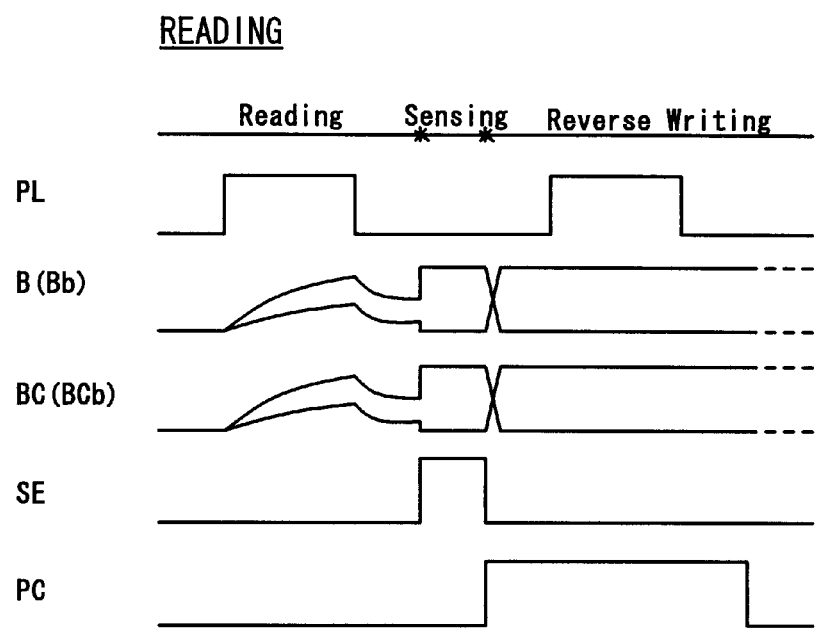
FIG. 3B is a timing chart for explaining the action of reading data from the ferroelectric memory 10.

FIG. 3A is a timing chart for explaining the action of writing data to the ferroelectric memory 10. FIG. 3B is a timing chart for explaining the action of reading data from the ferroelectric memory 10. Actions of the ferroelectric memory 10 will be described with FIGS. 1 to 3B.

As shown in FIG. 3A, the action of writing data can be divided into a dummy reading action and a writing action. In the dummy reading action, the potential of a logic "0" of the plate line is made a logic "1" and then made back to a logic "0" again.

As shown in FIG. 3A, the action of writing data can be divided into dummy reading action, the potential of a logic "0" of the plate line is made a logic "1"then made back to a logic "0" again. During this time, the sense enabling line SE and the reversal control line PC remain at logic "0." Therefore, the sensing amplifiers 12 shown in FIGS. 2A and 2B both remain in the off state.

After the dummy reading action, a writing action is performed. In the writing action, the sense enabling line SE becomes a logic "1." During the time, the reversal control line PC remains at logic "0." Therefore, the sensing amplifiers 12 shown in FIGS. 2A and 2B both are turned on, the transistors AT1 and AT2 shown in FIG. 2A and 2B are turned on, and the inverters INV1 and INV2 remain in the off state.

At the same time that the sense enabling line SE becomes a logic "1," input data Di0–Di7 are given to bit lines of the column that includes memory cells D0–D7 that constitute the same access unit. Incidentally, it is preferable to give input data Di0–Di7 to the respective bit lines B while giving reversal input of the input data Di0–Di7, to respective bit lines Bb.

On the other hand, at the same time with the sense enabling line SE becoming a logic "1," a logic "0" is given to the bit line BC of the column that includes the polarity holding cell Dc provided as corresponding to the memory cells D0–D7. Practically it is preferable to give a logic "1" to the bit line BCb while giving a logic "0" to the bit line BC.

After that the plate line PL becomes from a logic "0" to a logic "1" and back to a logic "0" again. Through the above process, input data Di0–Di7 are written to the respective memory cells D0–D7 and at the same time, a logic "0" is written to the polarity holding cell Dc. After that, the sense enabling line SE returns to a logic "0" to end the writing action.

Next, the action of reading data will be described in reference to FIG. 3B. As shown in FIG. 3B, the reading action can be divided into a reading action, a sensing action, and a reverse writing action.

In the reading action, the potential of a logic "0" of the plate line PL is once made a logic "1" and then back to a logic "0" again. With this action, potentials commensurate with the values stored in the memory cells D0–D7 and the polarity holding cell Dc appear on the respectively paired bit lines B, Bb, . . . to which the respective memory cells D0–D7 belong, and on the paired bit lines BC and BCb to which the polarity holding cell Dc belongs.

During the time, the sense enabling line SE and the reversal control line PC remain in the state of a logic "0." Therefore, the sensing amplifiers 12 shown in FIGS. 2A and 2B both remain turned off.

Following the reading action, the sensing action is performed. In the sensing action, the sense enabling line SE is made a logic "1." During the time, the reverse control line PC remains at a logic "0." Therefore, the sensing amplifiers 12 shown in FIGS. 2A and 2B both are turned on. The transistors AT1 and AT2 shown in FIG. 2A and 2B are turned on, and the inverters INV1 and INV2 remain off.

By the action of the sensing amplifiers 12 being turned on, and on the basis of the potentials appearing on the bit lines B, Bb, . . . , BC, BCb by the above-described reading action, the potentials of the bit lines B, Bb, . . . , BC, BCb, become logic "1" or "0" and held at those logic levels.

The logic levels of the bit lines B, . . . , and bit lines BC obtained as described above are read out as output data Do0–Do7 (8 bits) through the "exclusive OR" elements Eo0–Eo7 shown in FIG. 1. For example, when it is assumed that the value of the memory cell D0 is a logic "1," the value of output data Do0 becomes a logic "1" if the stored value of the polarity holding cell Dc is a logic "0," and the value of output data Do0 becomes a logic "0" if the stored value of the polarity holding cell Dc is a logic "1."

After reading out the output data Do0–Do7 in the sensing action, a reversal writing action shown in FIG. 3 is performed. In the reversal writing action, the sense enabling line SE which has been a logic "1" becomes a logic "0", while the reversal control line PC which has been a logic "0" becomes a logic "1."

Therefore, the sensing amplifiers 12 shown in FIGS. 2A and 2B both remain turned on. However, the transistors AT1 and AT2 shown in FIG. 2A and 2B are turned off, and the inverters INV1 and INV2 are turned on.

As a result, values that are opposite to those stored in the sensing amplifier 12 appear on the bit lines B, Bb, and bit lines BC, BCb. That is, values as reversed from the values currently stored in the memory cells D0–D7 and the polarity holding cell Dc appear on the bit lines B, Bb, . . . , and bit lines BC, BCb.

After that, the plate line PL becomes from a logic "0" to a logic "1" and back to a logic "0" again. Through this process, values appearing on the bit lines B, Bb, . . . , and bit lines BC, BCb are written to the memory cells D0–D7 and the polarity holding cell Dc. That is, values as reversed of the values that have been stored in the memory cells D0–D7 and the polarity holding cell Dc are written to the memory cells D0–D7 and the polarity holding cell Dc. After that, the reversal control line PC returns to a logic "0" to end the data reading action.

As described above, in case the stored value of the memory cell D0 is a logic "1" and the stored value of the polarity holding cell Dc is a logic "0" before the data reading action, the value of the output data Do0 read by the sensing action is a logic By the reversal writing action that follows, the value of the memory cell D0 becomes a logic "0" and the stored value of the polarity holding cell Dc becomes a logic "1." This is because the directions of polarization of the ferroelectric capacitors FC1 and FC2 constituting the memory cell D0 and the polarity holding cell Dc are reversed. Even if the value of the memory cell D0 is read again under this condition, the value of the output data Do0 is still a logic "1."

That is, even if data are read many times, the values of output data Do0–Do7 to be read out remain unchanged, but the polarized directions of the ferroelectric capacitors FC1 and FC2 constituting the memory cells D0–D7 and the polarity holding cell Dc are reversed. As a result, the imprint effect is unlikely to occur even if data reading action is repeated.

Figure 4:
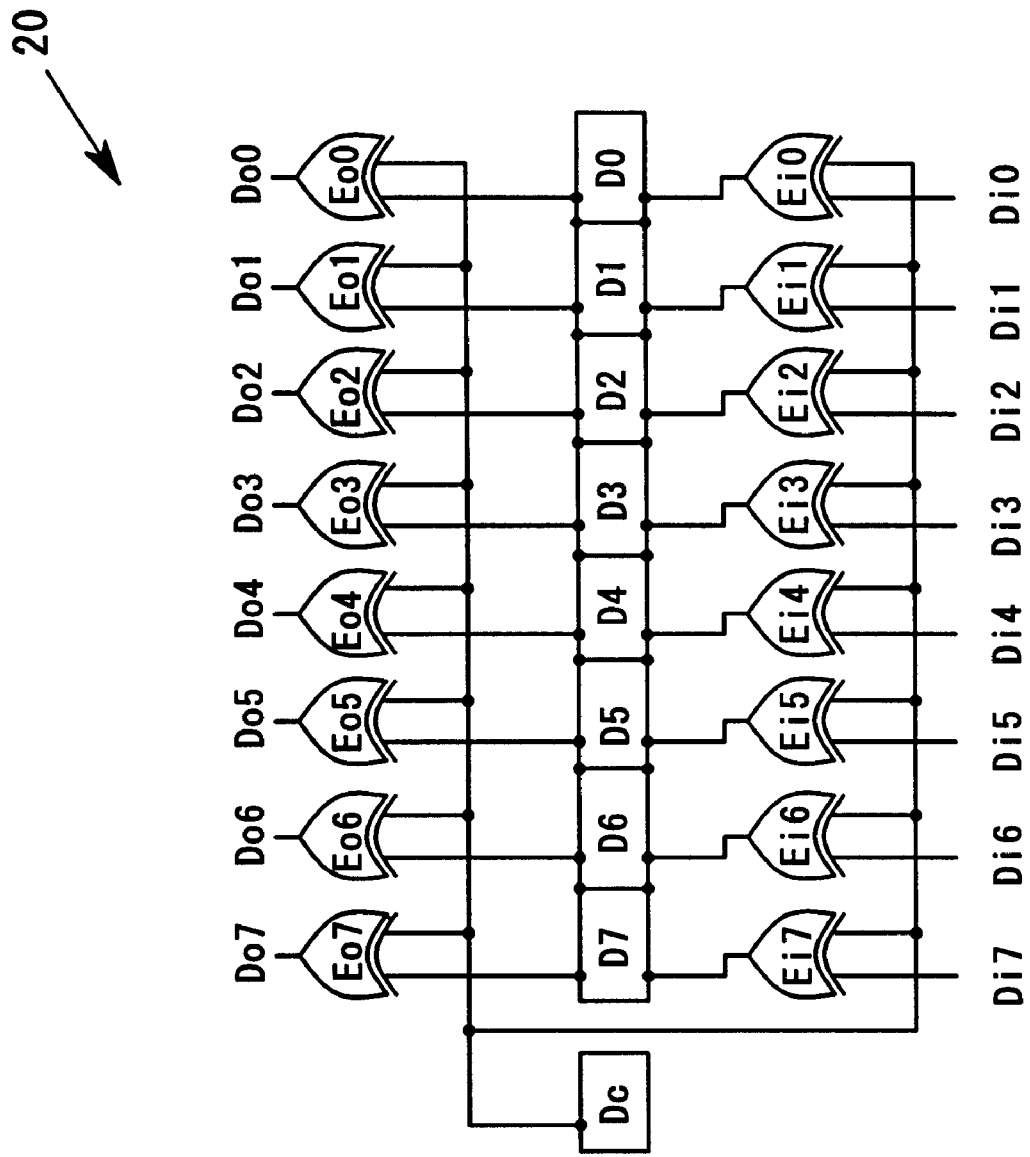
FIG. 4 schematically shows part (for one access) of the circuit constitution of a ferroelectric memory 20, a nonvolatile data memory device, as another embodiment of the present invention.

FIG. 4 schematically shows part (a unit for one access) of the circuit constitution of a ferroelectric memory 20, a nonvolatile data memory device, as another embodiment of the present invention. The constitution of the ferroelectric memory 20 is similar to that of the ferroelectric memory 10 shown in FIG. 1. The circuit constitution of the column that includes the memory cells D0, . . . and the circuit constitution of the column that includes the polarity holding cell Dc are also the same as those shown in FIGS. 2A and 2B.

However, the ferroelectric memory 20 is different from the ferroelectric memory 10 in that the values stored in the memory cells D0–D7 and the polarity holding cell Dc are reversed not only when reading data but also when the same data are written.

As shown in FIG. 4, while the ferroelectric memory 20, as well as the ferroelectric memory 10, is provided with output-purpose exclusive OR elements Eo0, . . . , one for each column that includes memory cells of the matrix, it is also provided with input-purpose exclusive OR elements Ei0, . . . , one for each column that includes memory cells of the matrix.

In other words, input data Di0–Di7 (8 bits) are inputted to the input ends on one side of the exclusive OR elements Ei0–Ei7, and the output end of the polarity holding cell Dc is connected also to the input ends on the other side of the exclusive OR elements Ei0–Ei7. Therefore, an exclusive OR of each of input data Di0–Di7 and the values stored in the polarity holding cell Dc is written to each of memory cells D0–D7. Otherwise the constitution is similar to that of the ferroelectric memory 10.

Figure 5A:
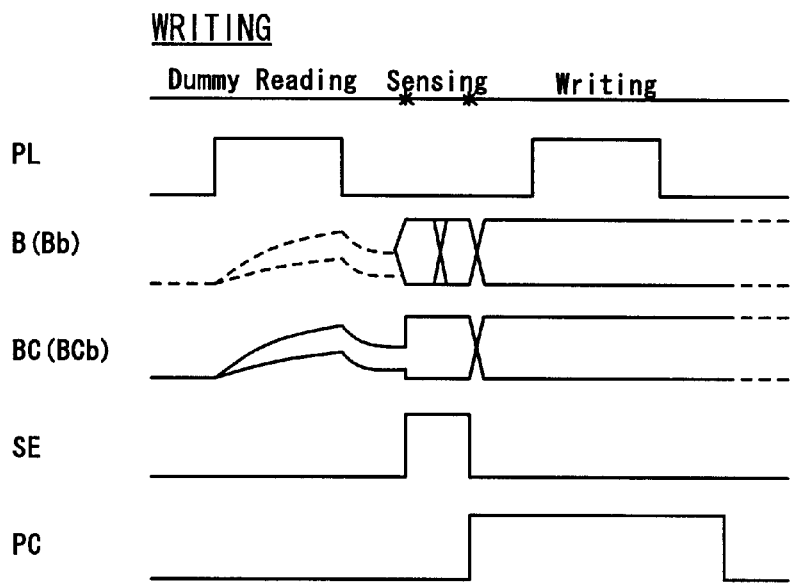
FIG. 5A is a timing chart for explaining the action of writing data to the ferroelectric memory 20.
Figure 5B:
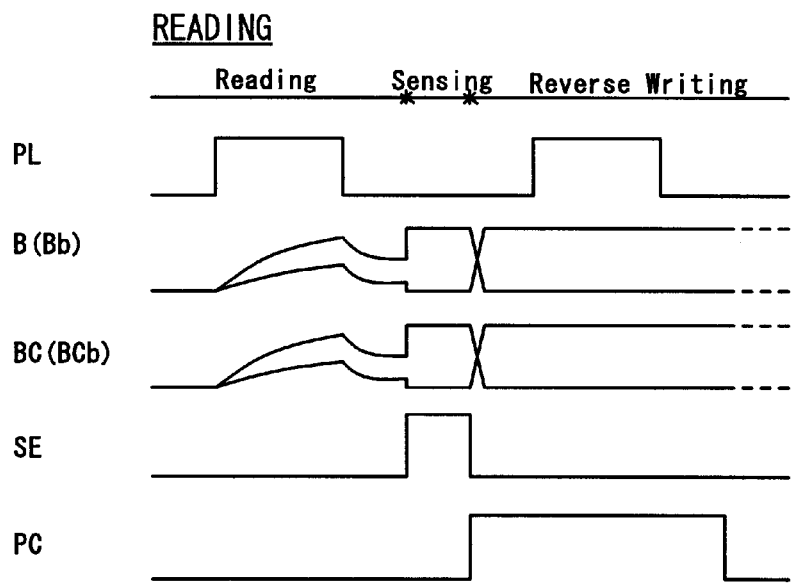
FIG. 5B is a timing chart for explaining the action of reading data from the ferroelectric memory 20.

FIG. 5A is a timing chart for explaining the action of writing data to the ferroelectric memory 20. FIG. 5B is a timing chart for explaining the action of reading data from the ferroelectric memory 20. Since the reading action is similar to that with the ferroelectric memory 10, explanation of the reading action is omitted and only the writing action will be described.

As shown in FIG. 5A, data writing action, unlike that with the ferroelectric memory 10, can be divided into a dummy reading action, a sensing action, and a writing action.

In the dummy reading action, the potential of the plate line PL that has been a logic "0" is once made a logic "1" and then back to a logic "0" again. With this action, potentials commensurate with the values stored in the memory cells D0–D7 and the polarity holding cell Dc appear on the respectively paired bit lines B, Bb, . . . to which the respective memory cells D0–D7 belong, and on the paired bit lines BC and BCb to which the polarity holding cell Dc belongs.

During that time, the sense enabling line SE and the reversal control line PC remain to be a logic "0." Therefore, the sensing amplifiers 12 shown in FIGS. 2A and 2B both remain to be off.

A detecting action follows the dummy reading action. In the detecting action, the sense enabling line SE becomes a logic "1." During that time, the reversal control line PC remains to be a logic "0." Therefore, the sensing amplifiers 12 shown in FIGS. 2A and 2B both remain to be on. The transistors AT1 and AT2 shown in FIGS. 2A and 2B are turned on, and the inverters INV1 and INV2 remain to be off.

By the action of the sensing amplifiers 12 being turned on, and on the basis of the potentials produced on the paired bit lines B, Bb, . . . , and the paired bit lines BC, BCb by the above-described dummy reading action, the potentials of the bit lines B, Bb, . . . , BC, BCb, become logic "1" or "0" and held at those levels.

The logic level of the bit line BC obtained as described above is inputted to the input ends on one side of the exclusive OR elements Ei0–Ei7 shown in FIG. 4. At the same time with that, input data Di0–Di7 are given to the input ends on the other side of the exclusive OR elements Ei0–Ei7.

Immediately after that, the exclusive OR elements Ei0–Ei7 are turned on. As a result, the outputs of the exclusive OR elements Ei0–Ei7, namely bit lines B to which the memory cells D0–D7 belong, becomes an exclusive OR of the input data Di0–Di7 and the value stored in the polarity holding cell Dc.

For example, with an assumption of the input data Di0 being a logic "1," the value of the bit line B to which the memory cell D0 belongs is a logic "1" if the stored value of the polarity holding cell Dc is a logic "0," and the value of the bit line B to which the memory cell D0 belongs is a logic "0" if the stored value of the polarity holding cell Dc is a logic "1."

In other words, with the detecting action, the value stored in the polarity holding cell Dc appears on the bit line BC, and an exclusive OR of the value stored in the polarity holding cell Dc and the input data Di0–Di7 appears on each of the bit lines B.

As shown in FIG. 5A, the detecting action is followed by a writing action. In the writing action, the sense enabling line SE that has been a logic "1" becomes a logic "0" while the reversal control line PC that has been a logic "0" becomes a logic "1."

Therefore, though the sensing amplifiers 12 shown in FIGS. 2A and 2B are both shown remaining to be on, the transistors AT1 and AT2 shown in FIGS. 2A and 2B are turned off, and the inverters INV1 and INV2 are turned on.

As a result, values that are opposite to those stored in the sensing amplifier 12 appear on the bit lines B, Bb, . . . , and the bit lines BC, BCb. That is, values as reversed exclusive OR of the polarity holding cell Dc and the input data Di0–Di7 appear on the bit lines B, Bb, . . . and the values as reversed from the values stored in the polarity holding cell Dc appear on the bit lines BC and BCb.

After that, the plate line PL becomes from a logic "0" to a logic "1" and back to a logic "0" again. Through this process, values appearing on the bit lines B, . . . , and the bit lines BC are written to the memory cells D0–D7 and the polarity holding cell Dc. That is, values as reversed from the values that have been stored in the polarity holding cell Dc are written to the polarity holding cell Dc, while the exclusive OR of the input data Di0–Di7 and the polarity holding cell Dc after being reversed is written to each of the memory cells D0–D7. After that, the reversal control line PC returns to a logic "0" to end the data writing action.

For example, if the value of the input data Di0 is a logic "1" and the stored value of the polarity holding cell Dc is a logic "0," data writing action causes the value of the polarity holding cell Dc to become a logic "1" and a logic "0" is written to the memory cell D0. If the value of the memory cell D0 in this state is read, the value of the output data Do0 will be a logic "1," the same as the input data Di0.

When a logic "1" as an input data Di0 is inputted in the state of the stored value of the polarity holding cell Dc becoming a logic "1," data writing action shown in FIG. 5A causes the stored value of the polarity holding cell Dc becomes a logic "0 " and a logic "1" is written to the memory cell D0. This means that, even in case the same value of input data Di0 is written, the polarized directions of the ferroelectric capacitors FC1 and FC2 constituting the memory cell D0 and polarity holding cell Dc are reversed. Even if the value of the memory cell D0 is read in this state, the value of the output data Do0 is still a logic "1," the same as the input data Di0.

In other words, even if the same data is written repeatedly, the values of the output data Do0–Do7 to be read remain the same. However, polarized directions of the ferroelectric capacitors FC1 and FC2 constituting the memory cells D0–D7 and the polarity holding cell Dc are reversed every time the same data are written. Therefore, the imprint effect is unlikely to occur even if the same data are written repeatedly.

As a matter of course, it is the same as in the case of the ferroelectric memory 10 shown in FIG. 1 in that the polarized directions of the ferroelectric capacitors FC1 and FC2 constituting the memory cells D0–D7 and the polarity holding cell Dc are reversed every time data are read while the values of the output data Do0–Do7 to be read remain the same even if the same data is read repeatedly. In other words, in the ferroelectric memory 20 shown in FIG. 4, the imprint effect is unlikely to occur even if the same data are written or read repeatedly.

Figure 6:
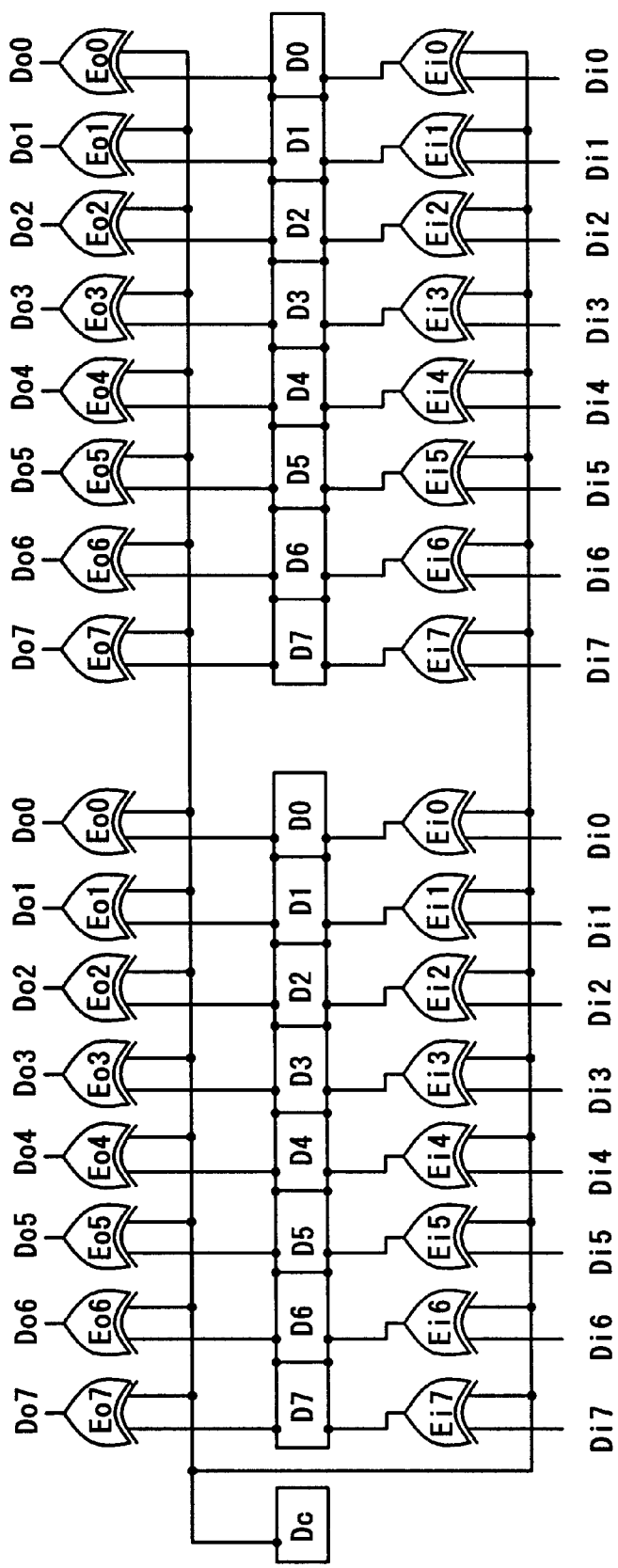
FIG. 6 schematically shows part (for N accesses) of the circuit constitution of a ferroelectric memory 30 (and 40), a nonvolatile data memory device, as still another embodiment of the present invention.

Next, FIG. 6 schematically shows part (N access units) of the circuit constitution of a ferroelectric memory 30, a nonvolatile data memory device, as still another embodiment of the present invention. The ferroelectric memory 30 is constituted similarly to the ferroelectric memory 10 shown in FIG. 1, and the circuit constitution of the column that includes memory cells D0, . . . and the circuit constitution of the column that includes the polarity holding cell Dc are also the same as those shown in FIGS. 2A and 2B.

However, the ferroelectric memory 30 is different from the ferroelectric memory 10 in that the former includes a 1-bit polarity holding cell Dc for every N sets (N access units) of memory cells D0–D7 (memory cells of one access unit) of 8 bits (1 byte) which is a minimum unit for access, and that the N access units (N×8 bits) of the memory cells D0, . . . and the 1-bit polarity holding cell Dc are driven with independent one plate line PL and one word line WL (FIG. 2).

With the above constitution, since only one polarity holding cell Dc suffices for plural access units, space is prevented from increasing. Such a ferroelectric memory 30 may be used for example as a general memory having a large number of memory cells. While FIG. 6 is described with N=2 for convenience, N may be more than two.

As shown in FIG. 6, the ferroelectric memory 30 has exclusive OR elements Eo0, . . . and exclusive OR elements Ei0, . . . , respectively one for each column of the matrix that includes memory cells.

The output ends of the memory cells D0, . . . constituting the N access units and the input ends on one side of the exclusive OR elements Eo0, . . . are interconnected, and the output end of the polarity holding cell Dc and the input ends on the other side of the exclusive OR elements Eo0, . . . are interconnected.

When data are to be read from the ferroelectric memory 30, the same reading action (FIG. 7B) as in the case of the ferroelectric memory 10 is made to all the memory cells D0, . . . (N×8 bits) constituting an N access units, and it becomes that the (8-bit) data of only one desired access unit of the memory cells D0–D7 is read outside.

Therefore, when the data is read, the polarized directions of the ferroelectric capacitors FC1 and FC2 constituting the memory cell are reversed not only for the one access unit of memory cells that is the subject of reading as a matter of course but also for the (N−1) access units of memory cells that are not the subjects of reading. Therefore, it is advantageous that the imprint effect is unlikely to occur not only for the unit of memory cells that is the subject of reading as a matter of course but also for the access units of memory cells that are not the subjects of reading.

When data are written to the ferroelectric memory 30, only one desired access unit of memory cells D0–D7 (8 bits) of all the memory cells D0, . . . (N×8 bits) constituting the N access units are enabled to accept data input, and the rest ((N−1)×8 bits) of them are disabled to accept data input.

Therefore, when data are written to the ferroelectric memory 30, an exclusive OR of 8-bit input data Di0–Di7 and stored value of the polarity holding cell Dc is inputted to the desired one access unit of memory cells D0–D7. However, no data are inputted to the rest of memory cells ((N−1)×8 bits). Otherwise the constitution is about the same as that of the ferroelectric memory 10.

Figure 7A:
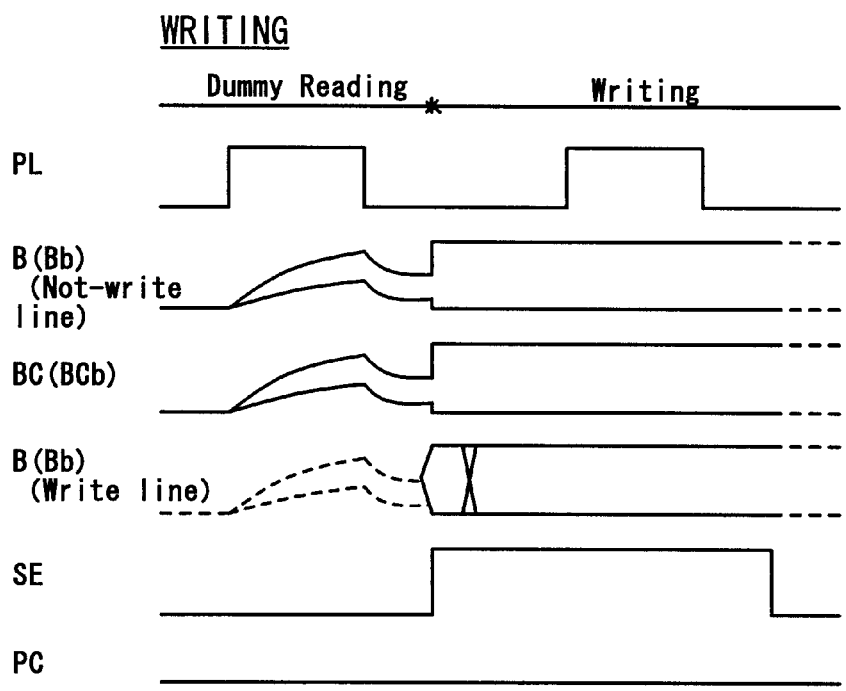
FIG. 7A is a timing chart for explaining the action of writing data to the ferroelectric memory 30.
Figure 7B:
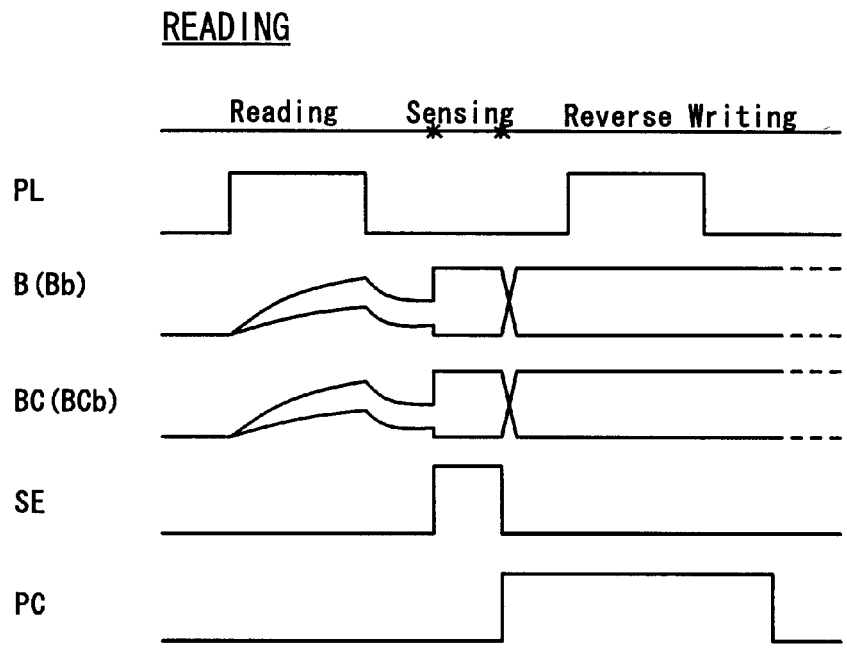
FIG. 7B is a timing chart for explaining the action of reading data from the ferroelectric memory 30.

FIG. 7A is a timing chart for explaining action of writing data to the ferroelectric memory 30. FIG. 7B is a timing chart for explaining action of reading data from the ferroelectric memory 30. Since the data reading action is the same as that with the ferroelectric memory 10, only the action of reading data will be described.

As shown in FIG. 7A, data writing can be divided like the case of the ferroelectric memory 10 into a dummy reading action and a writing action.

In the dummy reading action, the potential of the plate line PL that has been a logic "0" is once made a logic "1" and then back to a logic "0" again. With this action, potentials commensurate with the values stored in the memory cells D0, . . . and the polarity holding cell Dc appear on the respectively paired bit lines B, Bb, . . . (a write line and a not-write line to be described later) to which all the memory cells D0, . . . (N×8 bits constituting the N access units) belong, and on the paired bit lines BC and BCb to which the polarity holding cell Dc belongs.

The dummy reading action is followed by a writing action. In the writing action, the sense enabling line SE becomes a logic "1." During that time, the reversal control line PC remains to be a logic "0." Therefore, the sensing amplifiers 12 shown in FIGS. 2A and 2B are on. And the transistors AT1 and AT2 shown in FIGS. 2A and 2B both are on, and the inverters INV1 and INV2 remain off.

By the action of the sensing amplifier 12 which has been turned on, and according to potentials appearing on the respectively paired bit lines B, Bb, . . . and bit lines BC and BCb constituting a writing line and a not-writing line by the above-described dummy reading action, the potentials on the bit lines B, Bb, . . . , BC and BCb are changed to a logic "1" or a logic "0" and held to that logic level.

The logic level of the bit line BC obtained as described above is inputted to the input ends on one side of the exclusive OR elements Ei0–Ei7 shown in FIG. 6. At the same time, input data Di0–Di7 are given to the input ends on the other side of the eight exclusive OR elements Ei0–Ei7 corresponding to the desired one access unit, the subject of writing, of memory cells D0–D7.

Immediately after that, the eight exclusive OR elements Ei0–Ei7 become on. As a result, the outputs of the eight exclusive OR elements Ei0–Ei7, namely the value of the bit lines B to which the 8-bit memory cells D0–D7, subjects of writing, belong becomes the exclusive OR of the logic level of the bit line BC, namely of the value stored in the polarity holding cell Dc, and the input data Di0–Di7.

For example, with an assumption of the value of the input data Di0 being a logic "1," when the value stored in the polarity holding cell Dc is a logic "0," the potential of the bit line B (write line) to which the memory cell D0 belongs becomes a logic "1" and when the value stored in the polarity holding cell Dc is a logic "1," the potential of the bit line B (write line) to which the memory cell D0 belongs becomes a logic "0."

By the function of the sensing amplifier 12 which has been turned on, and according to the potential appearing by the above-described dummy reading action on the bit lines B (not-write line) to which the rest of the memory cells ((N−1)×8 bits not subject of writing) belong, the potentials on the not-write line become a logic "1" or a logic "0" and held to that logic level.

In other words, by the writing action, the value stored in the polarity holding cell Dc appears unchanged on the bit line BC, an exclusive OR of the value stored in the polarity holding cell Dc and the input data Di0–Di7 appears on respective write lines, and values stored in the memory cells that are not the subjects of writing appear unchanged on respective not-write lines.

After that, the plate line PL becomes from a logic "0" to a logic "1" and again back to a logic "0." Through this process, exclusive OR of the value stored in the polarity holding cell Dc and the input data Di0–Di7 are written to respective memory cells, the subject of writing. At the same time, the value stored before the writing action remains unchanged and written to the polarity holding cell Dc and the memory cells that are not the subjects of writing. Subsequently, the sense enabling line SE returns to a logic "0" to end the data writing action.

As described above, since the ferroelectric memory 30 does not reverse data when it writes data, the memory is possible to be realized with a relatively simple constitution.

Figure 8A:
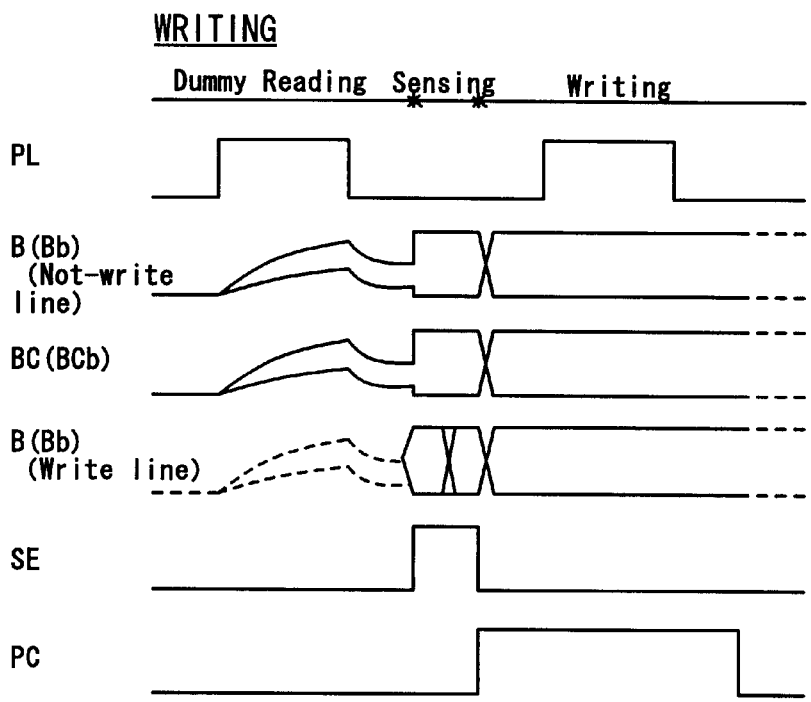
FIG. 8A is a timing chart for explaining the action of writing data to a ferroelectric memory 40, a nonvolatile memory device, as still another embodiment of the present invention.
Figure 8B:
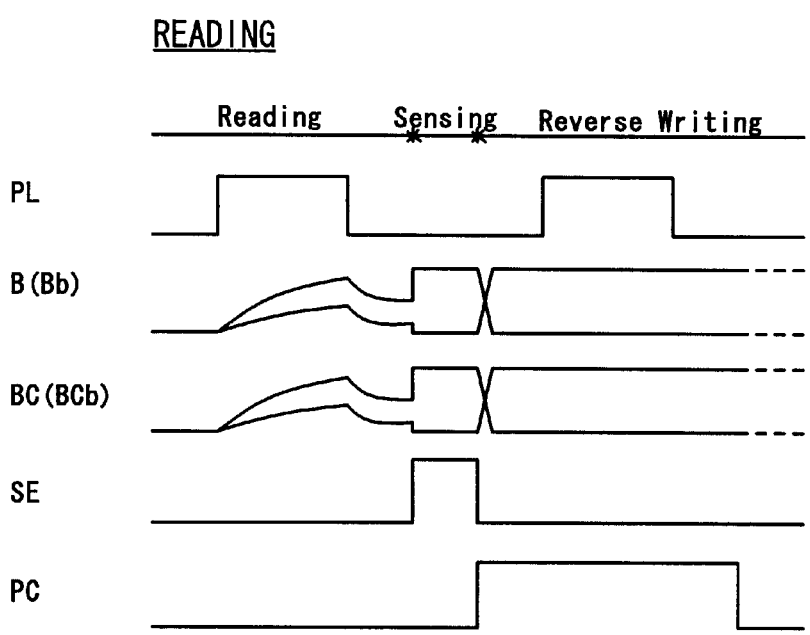
FIG. 8B is a timing chart for explaining the action of reading data from the ferroelectric memory 40.
Figure 9:
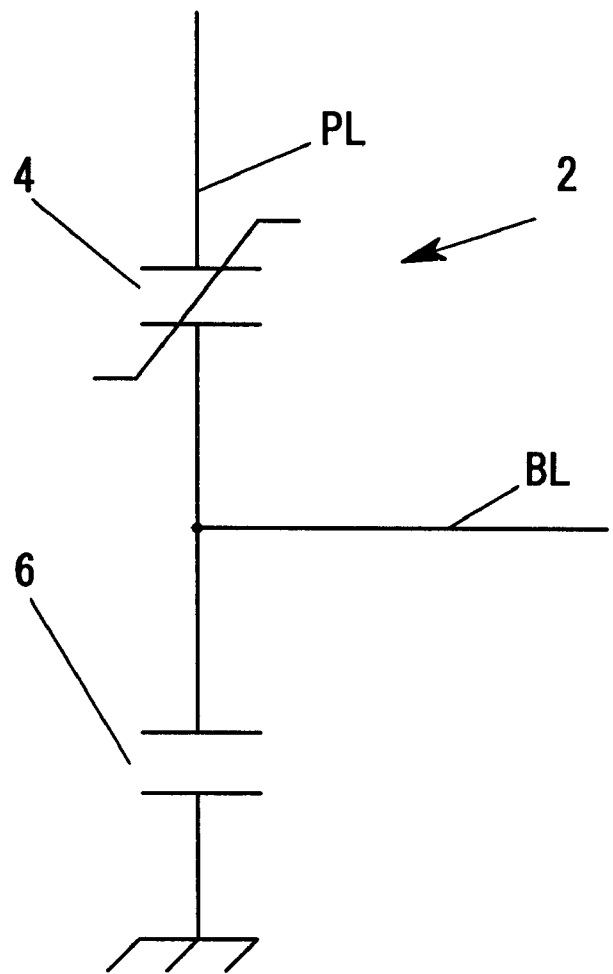
FIG. 9 shows part of the circuit constitution of a conventional ferroelectric memory element 2 of the 1T1C (one-transistor one-capacitor) type.

Next, FIGS. 8A and 8B show timing charts for explaining actions of writing data to and reading data from a ferroelectric memory 40, a nonvolatile memory device, as still another embodiment of the present invention.

Since the constitution of the ferroelectric memory 40 is nearly the same as that of the ferroelectric memory 30 (FIG. 6), its explanation is omitted. The action of reading data from the ferroelectric memory 40 is also the same as that with the ferroelectric memory 30 described above.

However, the ferroelectric memory 40 differs from the ferroelectric memory 30 in that it reverses data stored in all the memory cells D0, . . . (N×8 bits) constituting N access units and in the polarity holding cell Dc not only when reading but also when writing data.

To put it more in detail, when data are written, reversal of data is made for the data stored in the memory cells ((N−1)×8 bits) that are not the subjects of writing and the polarity holding cell Dc as well as the memory cells (8 bits) that are the subjects of writing in case the data written are the same as those of the previous time.

This is because the state of the sense enabling line SE and the reversal control line PC shown in FIG. 8A at the time of the actions following the dummy reading, namely the sensing action and the writing action, is different from that (state of the sense enabling line SE and the reversal control line PC at the time of writing) of the ferroelectric memory 30 shown in FIG. 7A.

That is to say, in the ferroelectric memory 40 as shown in FIG. 8, the sense enabling line SE that is once made a logic "1" after the dummy reading is made back a logic "0" and, at the same time, the reversal control line PC is made a logic "1." By such actions, all the logic levels appeared by the sense enabling line SE being made a logic "1" on the respective bit lines are revered.

As described above, the ferroelectric memory 40 is unlikely to cause the imprint effect in all the memory cells constituting N access units not only when data are read repeatedly but also when data are written repeatedly.

While the above embodiments are described in the case of one access unit being 8 bits, the present invention is applicable to cases of one access unit being more than and less than 8 bits. As a matter of course, the invention is applicable to the case of one access unit being 1 bit.

In the above embodiments, the exclusive OR element is used as a means for outputting data stored in the data memory element as not reversed or as reversed according to whether the data in the state memory section represents a non-reversed state or a reversed state. However, other means may also be used to constitute that data stored in the data memory element are outputted as not reversed or as reversed according to whether the data in the state memory section represents a non-reversed state or a reversed state.

In the above embodiments, the exclusive OR element is used as a means for inputting incoming data as not reversed or as reversed according to whether the data in the state memory section represents a non-reversed state or a reversed state. However, other means may also be used to constitute that incoming data are inputted as not reversed or as reversed according to whether the data in the state memory section represents a non-reversed state or a reversed state.

While the above embodiments are explained by giving examples of using ferroelectric memories with the so-called 2T2C type of memory elements, this invention is allocable not only to those embodiments but also to ferroelectric memories with the so-called 1T1C (one-transistor one-capacitor) type of memory elements or ferroelectric memories with memory elements made of FETs (field effect transistors) using ferroelectric materials.

While the above embodiments are explained by giving examples of memory elements using data memory elements made of ferroelectric, the data memory elements for use in this invention are not limited to those in the above embodiments. In effect, any data memory element may be used as far as its direction of change in the data holding characteristic varies with the values of the stored data. Therefore, the invention is applicable not only to data memory devices using nonvolatile data memory elements but also to those using volatile data memory elements.

Incidentally, the circuits, timing charts, etc. in the above embodiments are given as examples and so the invention is not restricted by those examples.

A data memory device according to the invention is provided with data memory elements with its direction of change in the data holding characteristic being different according to the value of data to be stored, characterized in that the device is provided with data memory elements for storing data in either not reversed or reversed state in nonvolatile manner, and a state memory section for storing whether the data stored in the data memory element is in the non-reversed or reversed state, and constituted that, when reading data from the data memory elements, the data stored in the data memory element is outputted as not reversed or as reversed according to whether the value in the state memory section represents a not reversed state or a reversed state, the data is stored again as reversed in the data memory element and, at the same time, the value in the state memory section is stored again as reversed.

Therefore, data stored in the data memory elements are reversed every time the data are read from the data memory elements. Therefore, even in case the same data are read repeatedly, the direction of change in the data holding characteristic changes every time the reading action is made. In other words, even if the reading action is repeated, the data holding characteristic does not deviate to one direction. Namely, data are read accurately even if the reading action is repeated.

A data memory device according to the invention is characterized in that, when data are to be written to data memory elements, the inputted data are stored as not reversed in the data memory elements, and values in the state memory section are set to those that represent a not reversed state.

In other words, data are not reversed when writing action is made. Therefore it is possible to realize a simple constitution of data memory device capable of reading data accurately even when data reading action is repeated. Such a data memory device is highly cost-effective in such cases as when using it mainly as a ROM (red-only memory) that is used more frequently for reading than writing, or even when data that are different from the previous data are written frequently.

A data memory device according to the invention is characterized in that, when data are to be written to data memory elements, the inputted data are stored either as reversed or not reversed in the memory elements according to whether the values in the state memory section represent a non-reversed state or a reversed state, and the values in the state memory section are re-stored as reversed.

In effect, data are reversed also when writing. Therefore, data are read accurately not only when reading action is repeated but also when writing action is repeated. In particular, also when the same data are written repeatedly with a high frequency, it is advantageous because the data holding characteristic does not deviate in one direction.

A data memory device according to the invention is characterized by a constitution wherein a minimum unit for gaining access to the data memory device, or a group of data memory elements, is provided with a state memory section, and all the data stored in the group of data memory elements belonging to the access unit are made to be in the same state, non-reversed or reversed according to the data in the state memory section.

Therefore, providing every access unit with a single state memory section makes it possible to realize a data memory device with simple circuit constitution and process timing without the necessity of considering other access units. Therefore, it is possible to apply the invention to data memory devices constituted that drive signals or the like for reading and writing are given to every access unit, such as data memory devices used as register circuits.

A data memory device according to the invention is characterized by being constituted
that a plural number of minimum access units for gaining access to the data memory device, or plural groups of data memory elements as a whole, is provided with a single state memory section,
that all the data stored in a group of data memory elements belonging to the same access unit out of plural data memory elements constituting the plural access units corresponding to the single state memory section become the same, non-reversed or reversed state,
that, when data are to be written to the data memory elements, for the data memory elements constituting the access units that are the subjects of writing, the data are stored as not reversed or reversed according to whether the data in the state memory section represent a non-reversed state or a reversed state,
that, for the data memory elements constituting the access units that are not the subjects of writing, the values of the data memory elements are re-stored as not reversed, and
that the values of the state memory section are re-stored as not reversed.

Therefore, only one state memory section suffices for a plural number of access units, and so space is prevented from increasing. Therefore, the invention can be used in the data memory device in which drive signals or the like for reading and writing are given to every group of plural number of access units, for example data memory devices having a large number of memory elements and used as general memories.

In addition, since data are not reversed in writing actions, a data memory device capable of accurate data reading even with repeated reading actions can be provided in relatively simple constitution.

A data memory device according to the invention is characterized by being constituted
that a plural number of minimum access units for gaining access to the data memory device, or plural groups of data memory elements as a whole, is provided with a single state memory section,
that all the data stored in a group of data memory elements belonging to the same access unit out of plural data memory elements constituting the plural access units corresponding to the single state memory section become the same non-reversed or reversed state,
that, when data are to be written to the data memory elements, for the data memory elements constituting the access units that are the subject of writing, the data are stored as reversed or not reversed according to whether the data in the state memory section represent a non-reversed state or a reversed state,
that, for the data memory elements constituting the access units that are not the subjects of writing, the data of the data memory elements are re-stored as reversed, and
that the data of the state memory section are re-stored as reversed.

Therefore, only one state memory section suffices for a plural number of access units, and so the increase in space is prevented. Therefore, the invention can be used in the data memory device in which drive signals or the like for reading and writing are given to every group of plural number of access units, for example data memory devices that have a large number of memory elements and are used as general memories.

Since data are reversed in the writing action, data can be read accurately not only when reading action is repeated but also when writing action is repeated.

A data memory device according to the invention is characterized in that data memory elements are made of ferroelectric and that data stored in the data memory elements are reversed by reversing the polarized state of the ferroelectric.

Therefore, data holding characteristic does not deviate to one direction even if reading action is repeated in the data memory device constituted with memory elements made of ferroelectric that is likely to cause imprint effect.

A data memory device according to the invention is characterized in
that data memory elements and the state memory section are both constituted with memory elements having ferroelectric capacitors in about the same constitution, and
that data stored in the data memory elements or data in the state memory section are reversed and re-stored by reversing the polarized state of the ferroelectric capacitors by reversing the output of the sensing amplifier that determines the polarized state of the capacitors.

Therefore, constituting the data memory elements and the state memory section with the memory elements having the ferroelectric capacitors in about the same constitution makes it possible to realize a data memory device with more simple circuitry and process timing and capable of reading data accurately even if the reading action is repeated. It is also possible to reverse and re-store data stored in the data memory elements or the data in the state memory section by a simple action of reversing the output of the sensing amplifier.

As a result, a data memory device capable of accurately reading data even when reading action is repeated can be realized with more simple circuitry and process timing.

While the invention is described above byway of preferable embodiments, various terms are used not for limitation but for explanation, and may be changed within the scope of appended claims without departing from scope and spirit of the invention.

What is claimed is:

1. A data memory device provided with data memory elements with their direction of change in the data holding characteristic being different according to the value of data to be stored, characterized in that the device is further provided with data memory elements for storing data in either non-reversed or reversed state in nonvolatile manner, and a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed, and when data are to be written to said data memory elements, the inputted data are stored either as reversed or not reversed in the memory elements according to whether the value in the state memory section represents a non-reversed state or a reversed state, and the value in the state memory section are re-stored as reversed.

2. A data memory device provided with data memory elements with their direction of change in the data holding characteristic being different according to the value of data to be stored, characterized in that the device is further provided with data memory elements for storing data in either non-reversed or reversed state in nonvolatile manner, and a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed;

wherein a minimum unit for gaining access to said data memory device, or a group of said memory elements, is provided with a state memory section, and all the data stored in the group of data memory elements belonging to the access unit are made to be in the same non-reversed or reversed state according to the data in the state memory section.

3. A data memory device provided with data memory elements with their direction of change in the data holding characteristic being different according to the value of data to be stored, characterized in that the device is further provided with data memory elements for storing data in either non-reversed or reversed state in nonvolatile manner, and that the value of the state memory section is re-stored as not reversed.

4. A data memory device provided with data memory elements with their direction of change in the data holding characteristic being different according to the value of data to be stored, characterized in that the device is further provided with data memory elements for storing data in either non-reversed or reversed state in nonvolatile manner, and a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed, and constituted that a plural number of minimum access units for gaining access to the data memory device, or plural groups of said data memory elements as a whole, is provided with a single said state memory section, that all the data stored in a group of data memory elements belonging to the same access unit, out of plural data memory elements constituting the plural access units, corresponding to the single state memory section become the same non-reversed or reversed state, a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed; and constituted that a plural number of minimum access units for gaining access to the data memory device, or plural groups of said memory elements as a whole, is provided with a single said state memory section, that all the data stored in a group of data memory elements belonging to the same access unit, out of plural data memory elements constituting the plural access units, corresponding to the single state memory section become the same, non-reversed or reversed state, that, when data are to be written to the data memory elements, for the data memory elements constituting the access units that are the subjects of writing, the data are stored as not reversed or reversed according to whether the data in the state memory section represent a non-reversed state or a reversed state, that, for the data memory elements constituting the access units that are not the subjects of writing, the values of the data memory elements are re-stored as not reversed, and that, when data are to be written to the data memory elements, for the data memory elements constituting the access units that are the subject of writing, the data are stored as reversed or not reversed according to whether the data in the state memory section represent a non-reversed state or a reversed state that, for the data memory elements constituting the access units that are not the subjects of writing, the values of the data memory elements are re-stored as reversed, and that the values of the state memory section are re-stored as reversed.

5. A data memory device provided with data memory elements with their direction of change in the data holding characteristic being different according to the value of data to be stored, characterized in that the device is further provided with data memory elements for storing data in either non-reversed or reversed state in nonvolatile manner, and a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed, and characterized in that data memory elements are made of ferroelectric and that data stored in the data memory elements are reversed by reversing the polarized state of said ferroelectric, and characterized in that said memory elements and the state memory section are both constituted with memory elements having ferroelectric capacitors in about the same constitution, and that data stored in said data memory elements or values of the state memory section are reversed and re-stored by reversing the polarized state of said ferroelectric capacitors by reversing the output of the sensing amplifier that determines the polarized state of the capacitors.

6. A data memory device provided with data memory elements with their direction of change in the data holding characteristic being different according to the value of data to be stored, characterized in that the device is further provided with data memory elements for storing data in either non-reversed or reversed state in nonvolatile manner, and a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed, and characterized in that when data are to be written to said data memory elements, the inputted data are stored as not reversed in the data memory elements, and the value in said state memory section is set to represent a non-reversed state, and characterized by a constitution wherein a minimum unit for gaining access to said data memory device, or a group of data memory elements, is provided with a state memory section, and all the data stored in the group of data memory elements belonging to the access unit are made to be in the same non-reversed or reversed state.

7. A data memory device provided with data memory elements with their direction of change in the data holding characteristic being different according to the value of data to be stored, characterized in that the device is further provided with data memory elements for storing data in either non-reversed or reversed state in nonvolatile manner, and a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed and characterized in that, when data are to be written to said data memory elements, the inputted data are stored either as reversed or not reversed in the memory elements according to whether the value in the state memory section represents a non-reversed state or a reversed state, and the value in the state memory section are re-stored as reversed, and characterized by a constitution wherein a minimum unit for gaining access to said data memory device, or a group of data memory elements, is provided with a state memory section, and all the data stored in the group of data memory elements belonging to the access unit are made to be in the same not reversed or reversed state.

8. A data memory device according to claim 1, characterized in that data memory elements are made of ferroelectric and that data stored in the data memory elements are reversed by reversing the polarized state of said ferroelectric.

9. A data memory device provided with data memory elements with their direction of change in the data holding characteristic being different according to the value of data to be stored, characterized in that the device is further provided with data memory elements for storing data in either non-reversed or reversed state in nonvolatile manner, and a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed and characterized by a constitution wherein a minimum unit for gaining access to said data memory device, or a group of said memory elements, is provided with a state memory section, and all the data stored in the group of data memory elements belonging to the access unit are made to be in the same non-reversed or reversed state according to the data in the state memory section, and characterized in that data memory elements are made of ferroelectric and that data stored in the data memory elements are reversed by reversing the polarized state of said ferroelectric.

10. A data memory device provided with data memory elements with their direction of change in the data holding characteristic being different according to the value of data to be stored, characterized in that the device is further provided with data memory elements for storing data in either non-reversed or reversed state in nonvolatile manner, and a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed, and characterized by being constituted that a plural number of minimum access units for gaining access to the data memory device, or plural groups of said memory elements as a whole, is provided with a single said state memory section, that all the data stored in a group of data memory elements belonging to the same access unit, out of plural data memory elements constituting the plural access units, corresponding to the single state memory section become the same, non-reversed or reversed state, that, when data are to be written to the data memory elements, for the data memory elements constituting the access units that are the subjects of writing, the data are stored as not reversed or reversed according to whether the data in the state memory section represent a non-reversed state or a reversed state, that, for the data memory elements constituting the access units that are not the subjects of writing, the values of the data memory elements are re-stored as not reversed, and that the value of the state memory section is re-stored as not reversed, and characterized in that data memory elements are made of ferroelectric and that data stored in the data memory elements are reversed by reversing the polarized state of said ferroelectric.

11. A data memory device provided with data memory elements with their direction of change in the data holding characteristic being different according to the value of data to be stored, characterized in that the device is further provided with data memory elements for storing data in either non-reversed or reversed state in nonvolatile manner, and a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed, and constituted that a plural number of minimum access units for gaining access to the data memory device, or plural groups of said data memory elements as a whole, is provided with a single said state memory section, that all the data stored in a group of data memory elements belonging to the same access unit, out of plural data memory elements constituting the plural access units, corresponding to the single state memory section become the same non-reversed or reversed state, that, when data are to be written to the data memory elements, for the data memory elements constituting the access units that are the subject of writing, the data are stored as reversed or not reversed according to whether the data in the state memory section represent a non-reversed state or a reversed state, that, for the data memory elements constituting the access units that are not the subjects of writing, the values of the data memory elements are re-stored as reversed, and that the values of the state memory section are re-stored as reversed, and characterized in that data memory elements are made of ferroelectric and that data stored in the data memory elements are reversed by reversing the polarized state of said ferroelectric.

12. A data memory device provided with data memory elements with their direction of change in the data holding characteristic being different according to the value of data to be stored, characterized in that the device is further provided with data memory elements for storing data in either non-reversed or reversed state in nonvolatile manner, and a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed, and characterized in that, when data are to be written to said data memory elements, the inputted data are stored either as reversed or not reversed in the memory elements according to whether the value in the state memory section represents a non-reversed state or a reversed state, and the value in the state memory section are re-stored as reversed, and characterized by being constituted that, when data are to be written to said data memory element, the value in said state memory section is reversed, re-stored, and held, and an exclusive OR of the value in the state memory section after the re-storage and said inputted data is stored in the data memory element.

13. A data memory device provided with data memory elements with their direction of change in the data holding characteristic being different according to the value of data to be stored, characterized in that the device is further provided with data memory elements for storing data in either non-reversed or reversed state in nonvolatile manner, and a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed, and characterized by being constituted that a plural number of minimum access units for gaining access to the data memory device, or plural groups of said memory elements as a whole, is provided with a single said state memory section, that all the data stored in a group of data memory elements belonging to the same access unit, out of plural data memory elements constituting the plural access units, corresponding to the single state memory section become the same, non-reversed or reversed state, that, when data are to be written to the data memory elements, for the data memory elements constituting the access units that are the subjects of writing, the data are stored as not reversed or reversed according to whether the data in the state memory section represent a non-reversed state or a reversed state, that, for the data memory elements constituting the access units that are not the subjects of writing, the values of the data memory elements are re-stored as not reversed, and that the value of the state memory section is re-stored as not reversed, and said characterized by being constituted that, when data are to be written to data memory elements constituting the access unit that is the subject of the writing, an exclusive OR of the value in said state memory section and said inputted data is stored in the data memory element.

14. A data memory device provided with data memory elements with their direction of change in the data holding characteristic being different according to the value of data to be stored, characterized in that the device is further provided with data memory elements for storing data in either non-reversed or reversed state in nonvolatile manner, and a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed.

A data memory device according to claim 1, characterized by being constituted that a plural number of minimum access units for gaining access to the data memory device, or plural groups of said data memory elements as a whole, is provided with a single said state memory section, that all the data stored in a group of data memory elements belonging to the same access unit, out of plural data memory elements constituting the plural access units, corresponding to the single state memory section become the same non-reversed or reversed state, that, when data are to be written to the data memory elements, for the data memory elements constituting the access units that are the subject of writing, the data are stored as reversed or not reversed according to whether the data in the state memory section represent a non-reversed state or a reversed state, that, for the data memory elements constituting the access units that are not the subjects of writing, the values of the data memory elements are re-stored as reversed, and that the values of the state memory section are re-stored as reversed, and characterized by being constituted that a plural number of minimum access units for gaining access to the data memory device, or plural groups of said data memory elements as a whole, is provided with a single said state memory section, that all the data stored in a group of data memory elements belonging to the same access unit, out of plural data memory elements constituting the plural access units, corresponding to the single state memory section become the same non-reversed or reversed state, that, when data are to be written to the data memory elements, for the data memory elements constituting the access units that are the subject of writing, the data are stored as reversed or not reversed according to whether the data in the state memory section represent a non-reversed state or a reversed state, that, for the data memory elements constituting the access units that are not the subjects of writing, the values of the data memory elements are re-stored as reversed, and that the values of the state memory section are re-stored as reversed, and characterized by being constituted that when data are to be written to said data memory elements constituting the access unit that is the subject of the writing, the value in the state memory section is reversed, re-stored, and held, and an exclusive OR of the value in said state memory section after the re-storage and said inputted data is stored in the data memory element.

15. A data memory device provided with data memory elements with their direction of change in the data holding characteristic being different according to the value of data to be stored, characterized in that the device is further provided with data memory elements for storing data in either non-reversed or reversed state in nonvolatile manner, and a state memory section for storing whether the data stored in the data memory elements are in the non-reversed or reversed state, and constituted that when data are to be read from a data memory element, the data stored in the data memory element are outputted as not reversed or as reversed according to whether the data in the state memory section represent a non-reversed state or a reversed state, the data are stored again as reversed in the data memory element and, at the same time, the data in the state memory section are stored again as reversed, and characterized in that data memory elements are made of ferroelectric and that data stored in the data memory elements are reversed by reversing the polarized state of said ferroelectric, and characterized in that said memory elements and the state memory section are both constituted with memory elements having ferroelectric capacitors in about the same constitution, and that data stored in said data memory elements or values of the state memory section are reversed and re-stored by reversing the polarized state of said ferroelectric capacitors by reversing the output of the sensing amplifier that determines the polarized state of the capacitors, and characterized by being constituted that whether the out put of said sensing amplifier is to be outputted directly or through an inverter circuit maybe switched, and that the output of the sensing amplifier is reversed by switching to output through the inverter circuit.

* * * * *